United States Patent
Gredone et al.

(10) Patent No.: US 7,107,479 B2
(45) Date of Patent: *Sep. 12, 2006

(54) APPARATUS AND METHOD FOR BIDIRECTIONAL TRANSFER OF DATA BY A BASE STATION

(75) Inventors: Joseph Gredone, Chalfont, PA (US); Alfred W. Stufflet, Plymouth Meeting, PA (US); Timothy A. Axness, Collegeville, PA (US)

(73) Assignee: InterDigital Technology Corporation, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/001,958

(22) Filed: Dec. 2, 2004

(65) Prior Publication Data

US 2005/0105370 A1 May 19, 2005

Related U.S. Application Data

(63) Continuation of application No. 10/080,817, filed on Feb. 22, 2002, now Pat. No. 6,848,018, which is a continuation of application No. 09/990,060, filed on Nov. 21, 2001.

(51) Int. Cl.
*G06F 5/06* (2006.01)
*G06F 1/12* (2006.01)

(52) U.S. Cl. .......................... 713/600; 710/33; 710/71; 341/100; 341/101

(58) Field of Classification Search ................ 713/600, 713/375, 400, 500, 502; 341/100, 101; 455/138, 455/219; 710/33, 71
See application file for complete search history.

(56) References Cited

U.S. PATENT DOCUMENTS

| 4,675,861 A | 6/1987 | Uttermark |
| 5,018,142 A | 5/1991 | Simcoe et al. |
| 5,136,587 A | 8/1992 | Obana et al. |
| 5,327,126 A | 7/1994 | Beanland |
| 5,347,268 A | 9/1994 | Nelson et al. |
| 5,400,369 A | 3/1995 | Ikemura |

(Continued)

FOREIGN PATENT DOCUMENTS

| KR | 42847 | 4/1991 |

(Continued)

OTHER PUBLICATIONS von Herzen et al., "Multi-Chanel 622 Mb/s LVDS Data Transfer for Virtex-E Devices", Xilinx Inc., Jan. 6, 2001, http://direct.xilinx.com/bvdocs/appnotes/xapp233.pdf.

(Continued)

*Primary Examiner*—Lynne H. Browne
*Assistant Examiner*—Nitin C. Patel
(74) *Attorney, Agent, or Firm*—Volpe and Koenig P.C.

(57) ABSTRACT

A hybrid serial/parallel bus interface method and apparatus for a base station has a data block demultiplexing device. The data block demultiplexing device has an input configured to receive a data block and demultiplexes the data block into a plurality of nibbles. For each nibble, a parallel to serial converter converts the nibble into serial data. A line transfers each nibble's serial data. A serial to parallel converter converts each nibble's serial data to recover that nibble. A data block reconstruction device combines the recovered nibbles into the data block. The method/apparatus is adaptable for either bidirectional or unidirectional applications.

44 Claims, 8 Drawing Sheets

U.S. PATENT DOCUMENTS

| | | | |
|---|---|---|---|
| 5,420,583 | A | 5/1995 | Knecht et al. |
| 5,526,360 | A | 6/1996 | Kraft |
| 5,541,596 | A | 7/1996 | Yoshida |
| 5,544,319 | A | 8/1996 | Acton et al. |
| 5,570,089 | A | 10/1996 | Haas |
| 5,592,487 | A | 1/1997 | Knecht et al. |
| 5,602,780 | A | 2/1997 | Diem et al. |
| 5,635,933 | A | 6/1997 | Fitzpatrick et al. |
| 5,847,578 | A | 12/1998 | Noakes et al. |
| 5,926,120 | A | 7/1999 | Swenson et al. |
| 5,963,638 | A | 10/1999 | Sheets |
| 6,040,792 | A | 3/2000 | Watson et al. |
| 6,122,683 | A | 9/2000 | Ku et al. |
| 6,128,244 | A | 10/2000 | Thompson et al. |
| 6,134,247 | A | 10/2000 | Solana de Quesada et al. |
| 6,285,960 | B1 | 9/2001 | Fung et al. |
| 6,356,369 | B1 | 3/2002 | Farhan |
| 6,356,374 | B1 | 3/2002 | Farhan |
| 6,477,250 | B1 | 11/2002 | Sheets |
| 6,823,468 | B1 | 11/2004 | Gredone et al. |
| 6,823,469 | B1 | 11/2004 | Gredone et al. |
| 6,829,718 | B1 | 12/2004 | Gredone et al. |
| 6,848,018 | B1 | 1/2005 | Gredone et al. |

FOREIGN PATENT DOCUMENTS

| | | |
|---|---|---|
| KR | 1997-56528 | 7/1997 |

OTHER PUBLICATIONS

Kitanovska et al., "Bus LVDS with Virtex-E Devices", Xilinx Inc., Jul. 26, 2000, http://direct.xilinx.com/bvdocs/appnotes/xapp243.pdf.

"DS90CR211/DS90CR212 21-Bit Channel Link"; National Semiconductor; Santa Clara, California; http://www.national.com/ds/DS/DS90CR211.pdf.

Logue, "Virtex SelectLink Communications Channel"; Xilinx, Inc.; San Jose, California; Mar. 15, 2000; http://www.xilinx.com/bvdocs/appnotes/xapp234.pdf.

"LVDS System Data Framing"; Xilinx, Inc.; San Jose, California; Dec. 18, 2000; http://direct.xilinx.com/bvdocs/appnotes/xapp238.pdf.

"21-Bit Channel Link", National Semiconductor, Jul. 1997, http://www.national.com/ds/DS/DS90CR21.pdf.

Novak et al., "Channel Link Moving and Shaping Information in Point-To-Point Application", National Semiconductor, May 1996, http://www.national.com/an/AN/AN-1041.pdf.

Goldie, "DS92LV010A Bus LVDS Transceiver Ushers in a New Era of High-Performance Backplane Design", National Semiconductor, http://www.national.com/an/AN/AN-1115.pdf, Jul. 1998.

Huq et al., "An Overview of LVDS Technology", National Semiconductor, http://www.national.com/an/AN/AN-971.pdf, Jul. 1998.

"3606—Digitally Controlled Programmable Gain Instrumentation Amplifier", Burr-Brown Corporation, http://focus.ti.com/lit/ds/symlink/3606.pdf, Oct. 1983.

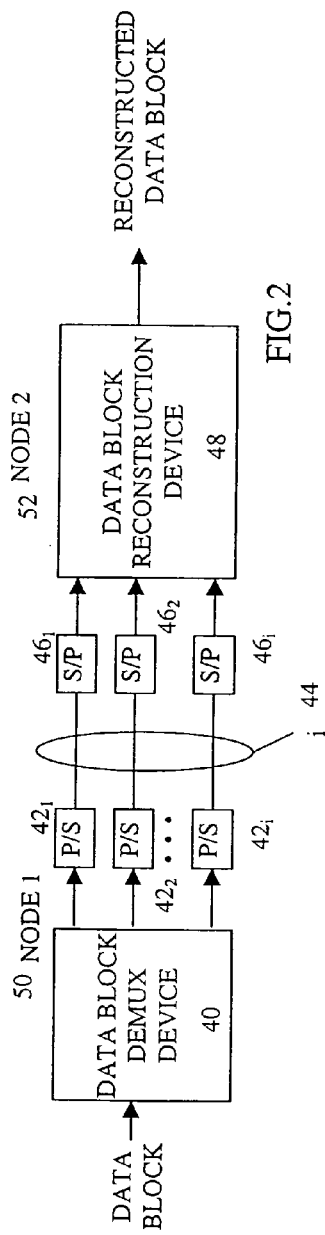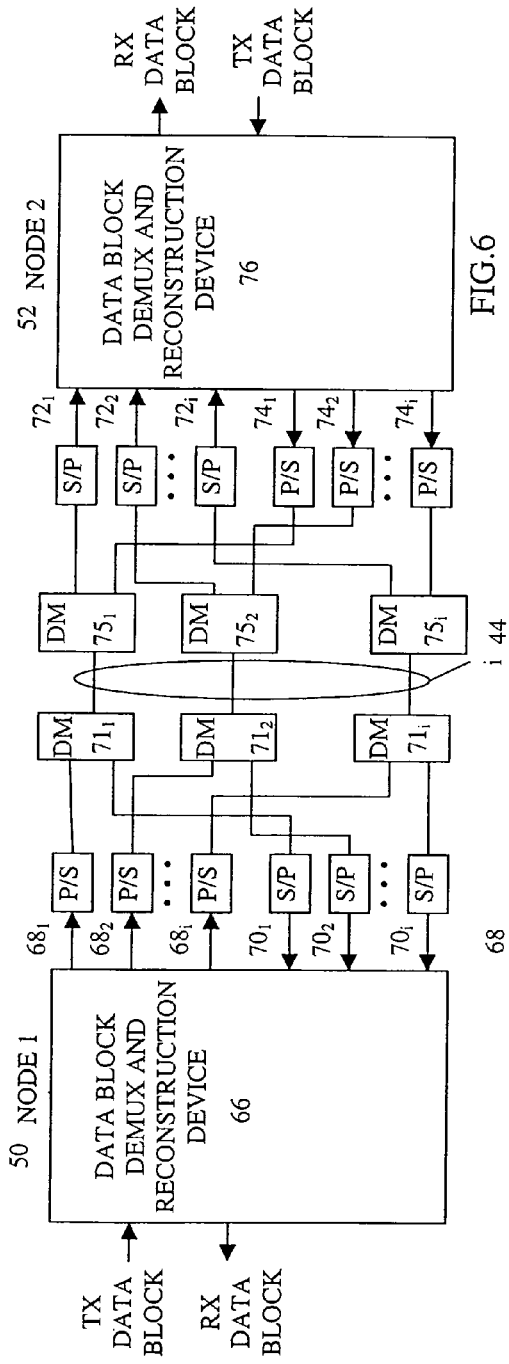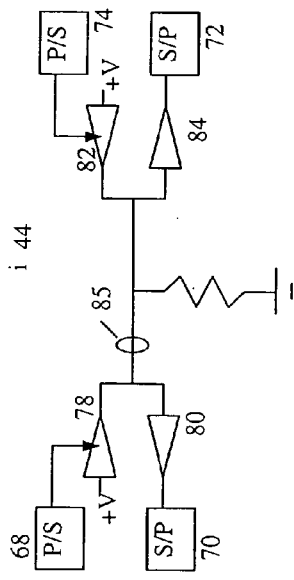

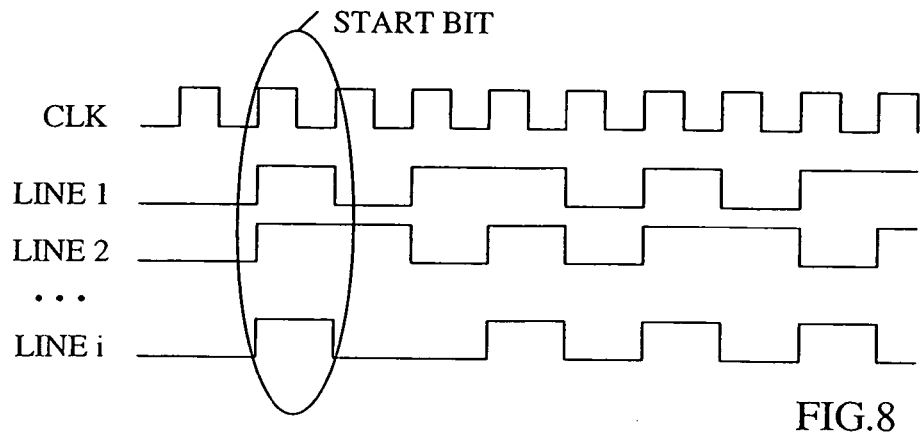
FIG.8
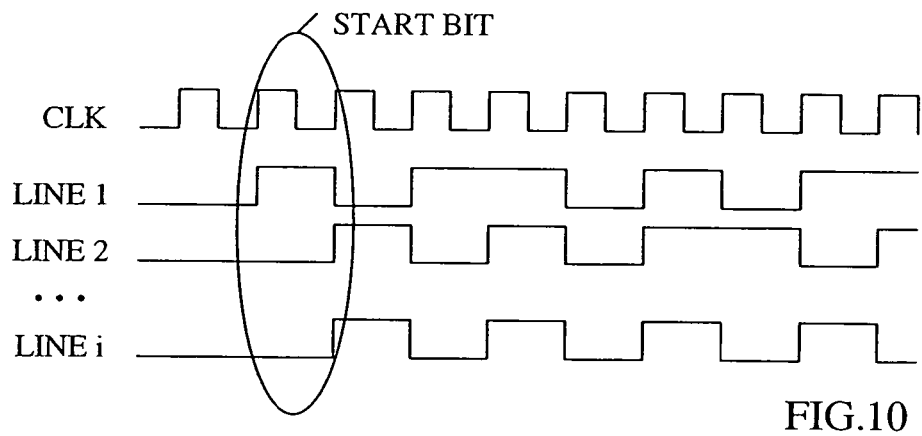
FIG.10
| FUNCTION | LINE 1 | LINE 2 |
|---|---|---|
| ABSOLUTE VALUE | 1 | 1 |
| RELATIVE INCREASE | 1 | 0 |
| RELATIVE DECREASE | 0 | 1 |
| NO DATA TRANSFERRED | 0 | 0 |
FIG.11
| FUNCTION | LINE 1 | LINE 2 |
|---|---|---|
| DEVICE 1 | 1 | 1 |
| DEVICE 2 | 1 | 0 |
| INVALID | 0 | 1 |
| NO DATA TRANSFERRED | 0 | 0 |
FIG.13

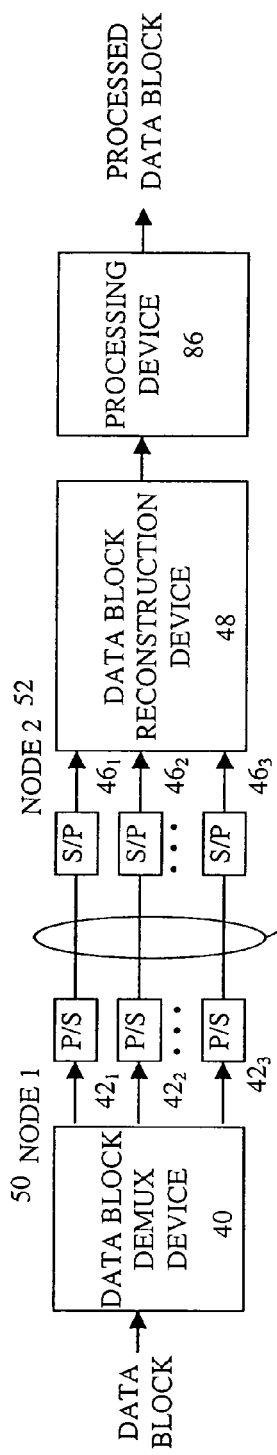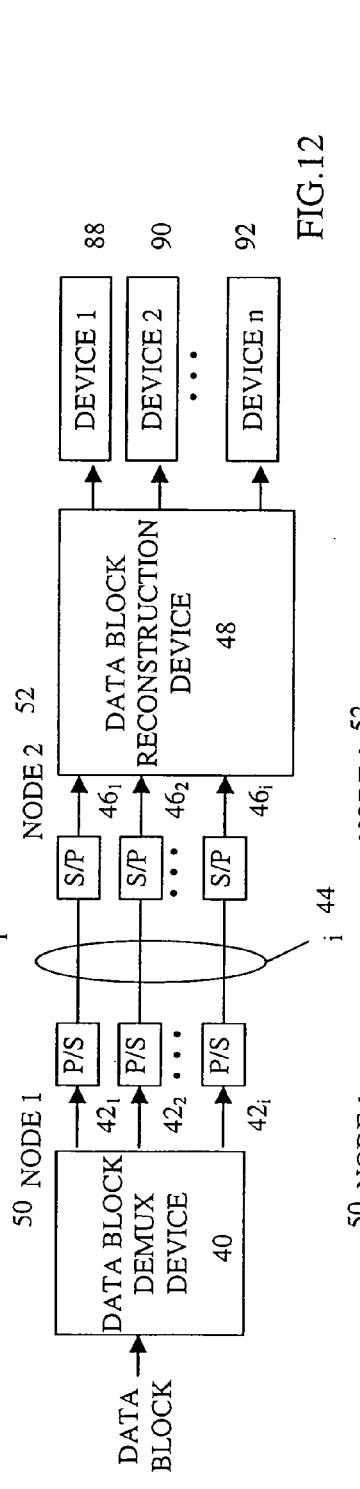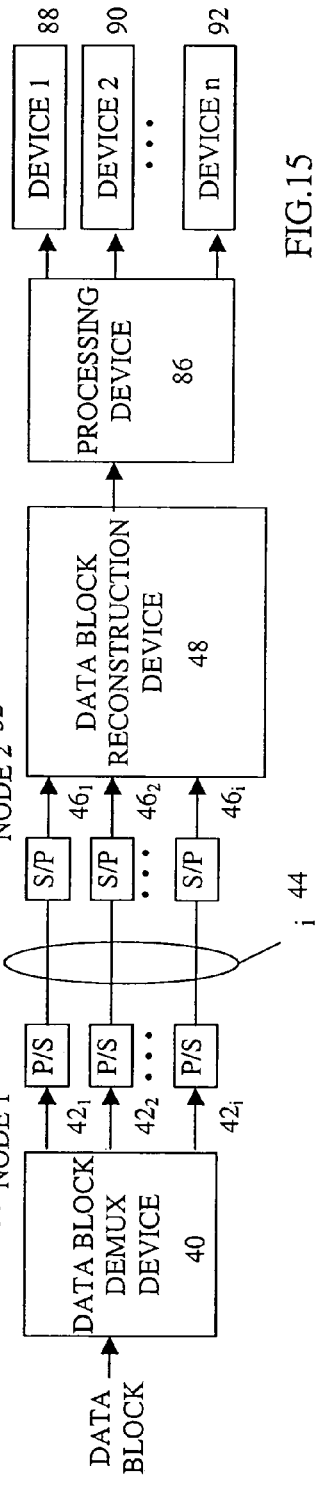

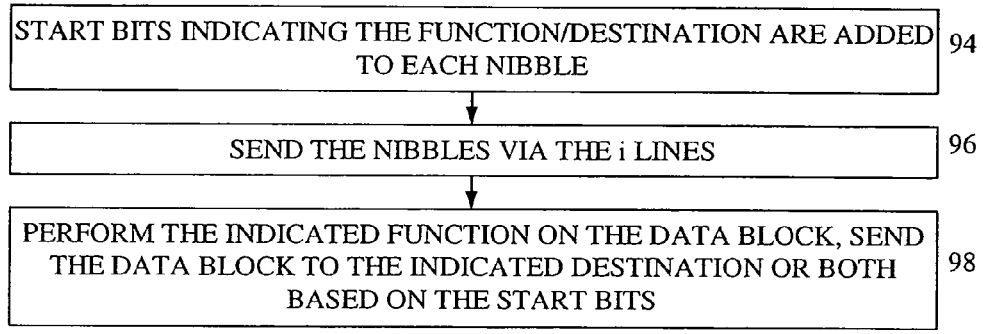

FIG.14

| FUNCTION/DEVICE | LINE 1 | LINE 2 | LINE 3 |
|---|---|---|---|
| ABSOLUTE VALUE/DEVICE 2 | 1 | 1 | 1 |
| ABSOLUTE VALUE/DEVICE 1 | 1 | 1 | 0 |
| RELATIVE INCREASE/DEVICE 2 | 1 | 0 | 1 |
| RELATIVE INCREASE/DEVICE 1 | 1 | 0 | 0 |
| RELATIVE DECREASE/DEVICE 2 | 0 | 1 | 1 |
| RELATIVE DECREASE/DEVICE 1 | 0 | 1 | 0 |
| INVALID | 0 | 0 | 1 |
| NO DATA TRANSFERRED | 0 | 0 | 0 |

START BITS INDICATING THE FUNCTION/DESTINATION ARE ADDED TO EACH NIBBLE — 94

↓

SEND THE NIBBLES VIA THE i LINES — 96

↓

PERFORM THE INDICATED FUNCTION ON THE DATA BLOCK, SEND THE DATA BLOCK TO THE INDICATED DESTINATION OR BOTH BASED ON THE START BITS — 98

FIG.16

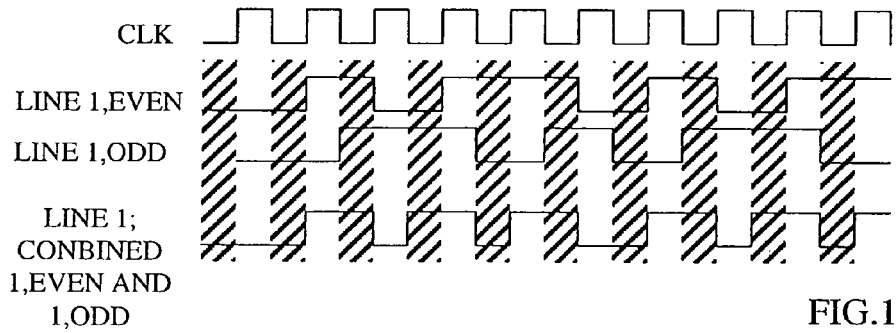

FIG.18

APPARATUS AND METHOD FOR BIDIRECTIONAL TRANSFER OF DATA BY A BASE STATION

This application is a continuation of U.S. patent application Ser. No. 10/080,817, filed Feb. 22, 2002 now U.S. Pat. No. 6,848,018, which in turn claims priority from U.S. patent application Ser. No. 09/990,060, filed Nov. 21, 2001, which are incorporated by reference as if fully set forth.

BACKGROUND

The invention relates to bus data transfers. In particular, the invention relates to reducing the number of lines used to transfer bus data.

One example of a bus used to transfer data is shown in FIG. 1. FIG. 1 is an illustration of a receive and transmit gain controllers (GCs) 30, 32 and a GC controller 38 for use in a wireless communication system. A communication station, such as a base station or user equipment, transmits (TX) and receives (RX) signals. To control the gain of these signals, to be within the operating ranges of other reception/transmission components, the GCs 30, 32 adjust the gain on the RX and TX signals.

To control the gain parameters for the GCs 30, 32, a GC controller 38 is used. As shown in FIG. 1, the GC controller 38 uses a power control bus, such as a sixteen line bus 34, 36, to send a gain value for the TX 36 and RX 34 signals, such as eight lines for each. Although the power control bus lines 34, 36 allow for a fast data transfer, it requires either many pins on the GCs 30, 32 and the GC controller 38 or many connections between the GCs 30, 32 and GC controller 38 on an integrated circuit (IC), such as an application specific IC (ASIC). Increasing the number of pins requires additional circuit board space and connections. Increasing IC connections uses valuable IC space. The large number of pins or connections may increase the cost of a bus depending on the implementation.

Accordingly, it is desirable to have other data transfer approaches.

SUMMARY

A hybrid serial/parallel bus interface has a data block demultiplexing device. The data block demultiplexing device has an input configured to receive a data block and demultiplexes the data block into a plurality of nibbles. For each nibble, a parallel to serial converter converts the nibble into serial data. A line transfers each nibble's serial data. A serial to parallel converter converts each nibble's serial data to recover that nibble. A data block reconstruction device combines the recovered nibbles into the data block. The interface is adapted for use by base stations (BSs) and user equipments (UEs) and is further adaptable for unidirection as well as bidirectional data transfer;

BRIEF DESCRIPTION OF THE DRAWING(S)

FIG. 2 is a block diagram of a hybrid parallel/serial bus interface.

FIG. 6 is a block diagram of a bidirectional hybrid parallel/serial bus interface.

FIG. 7 is a diagram of an implementation of one bidirectional line.

FIG. 8 is a timing diagram illustrating start bits.

FIG. 9 is a block diagram of a function controllable hybrid parallel/serial bus interface.

FIG. 10 is a timing diagram of start bits for a function controllable hybrid parallel/serial bus interface.

FIG. 11 is a table of an implementation of start bits indicating functions.

FIG. 12 is a block diagram of a destination controlling hybrid parallel/serial bus interface.

FIG. 13 is a table of an implementation of start bits indicating destinations.

FIG. 14 is a table of an implementation of start bits indicating destinations/functions.

FIG. 15 is a block diagram of a destinations/functions controlling hybrid parallel/serial bus interface.

FIG. 16 is a flow chart for start bits indicating destinations/functions.

FIG. 18 is a timing diagram for a positive and negative clock edge hybrid parallel/serial bus interface.

DETAILED DESCRIPTION OF THE PREFERRED EMBODIMENT(S)

Figure 1:
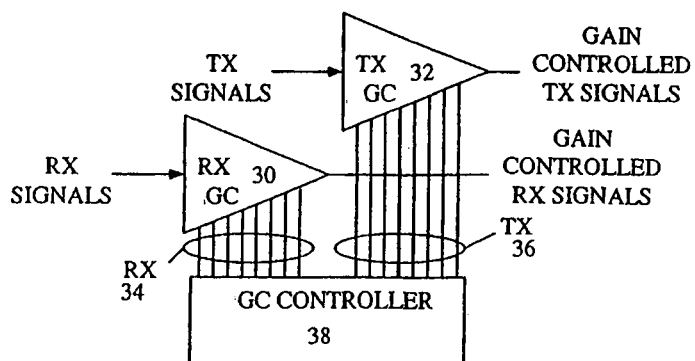
FIG. 1 is an illustration of a RX and TX GC and a GC controller.
Figure 3:
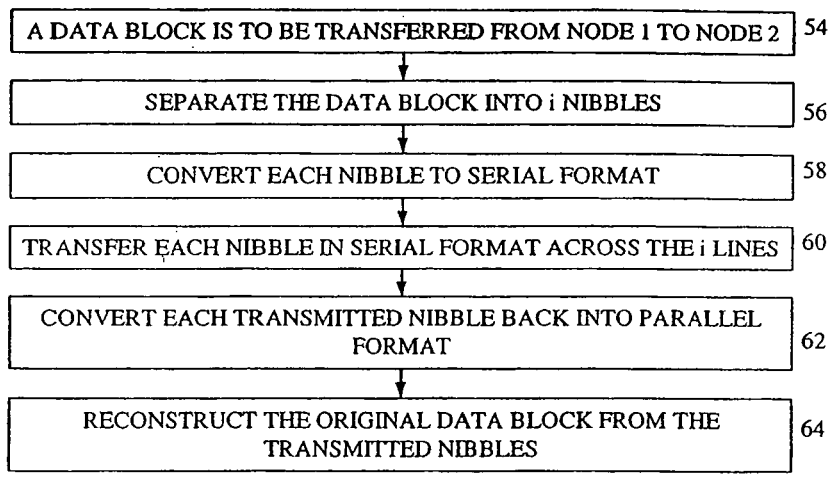
FIG. 3 is a flow chart for transferring data blocks using a hybrid parallel/serial bus interface.
Figure 4:
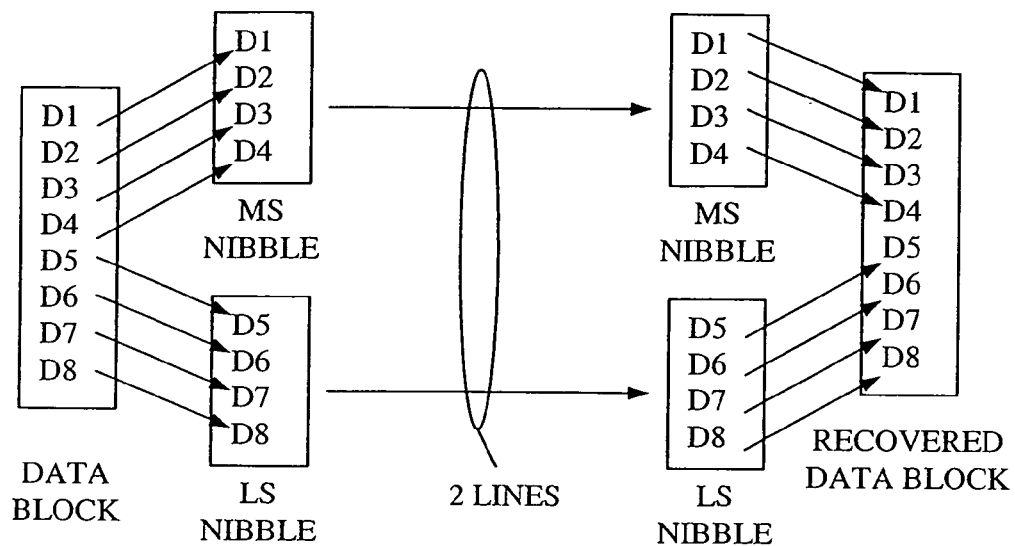
FIG. 4 illustrates demultiplexing a block into a most significant and least significant nibble.

FIG. 2 is a block diagram of a hybrid parallel/serial bus interface and FIG. 3 is a flow chart of hybrid parallel/serial bus interface data transfer. A data block is to be transferred across the interface i 44 from node 1 50 to node 2 52. A data block demultiplexing device 40 receives the block and demultiplexes it into i nibbles for transfer over i data transfer lines 44, (56). The value for i is based on a tradeoff between number of connections and transfer speed. One approach to determine i is to first determine a maximum latency permitted to transfer the data block. Based on the allowed maximum latency, a minimum number of lines required to transfer the block is determined. Using the minimum number of lines, the lines used to transfer the data is selected to be at least the minimum. The lines 44 may be the pins and their associated connections on a circuit board or connections on an IC. One approach to demultiplex into nibbles divides the block into a most significant to a least significant nibble. To illustrate for an eight bit block transfer over two lines as shown in FIG. 4, the block is demultiplexed into a four bit most significant nibble and a four bit least significant nibble.

Figure 5:
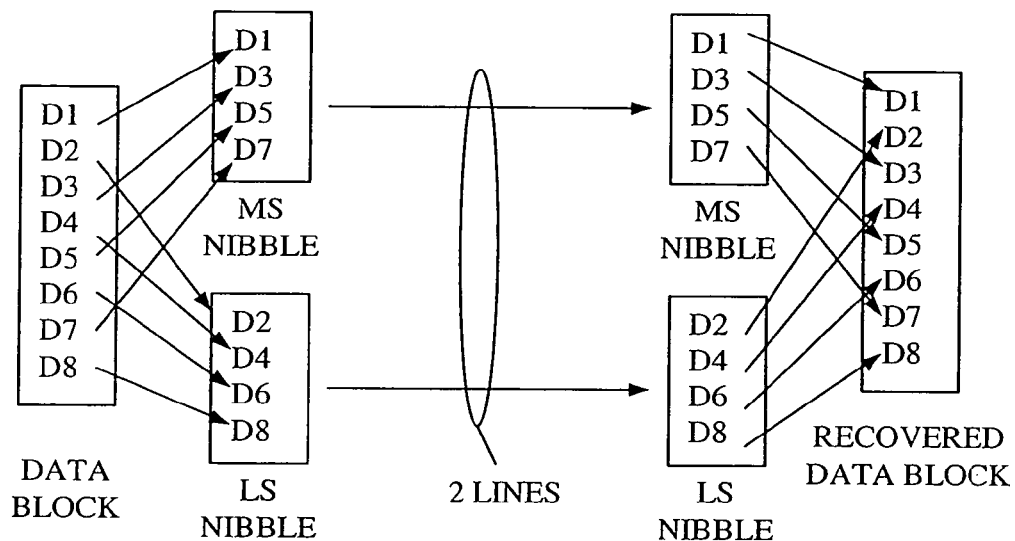
FIG. 5 illustrates demultiplexing a block using data interleaving.

Another approach interleaves the block across the i nibbles. The first i bits of the block become the first bit in each nibble. The second i bits become the second bit in each nibble and so on until the last i bits. To illustrate for an eight bit block over two connections as shown in FIG. 5, the first bit is mapped to the first bit of nibble one. The second bit is mapped to the first bit of nibble two. The third bit is mapped to the second bit of nibble one and so on until the last bit is mapped to the last bit of nibble two.

Each nibble is sent to a corresponding one of i parallel to serial (P/S) converters 42, (58), converted from parallel bits to serial bits, and transferred serially across its line, (60). On the opposing end of each line is a serial to parallel (S/P) converter 46. Each S/P converter 46 converts the transmitted serial data into its original nibble, (62). The i recovered nibbles are processed by a data block reconstruction device 48 to reconstruct the original data block, (64).

In another, bidirectional, approach, the i connections are used to transfer data in both directions as shown in FIG. 6. Information data may be transferred in both directions or information may be sent in one direction and an acknowledgment sent back in the other direction. A data block for transfer from node 1 50 to node 2 52 is received by the data block demultiplexing and reconstruction device 66. The demultiplexing and reconstruction device 66 demultiplexes the block into i nibbles. i P/S converters 68 convert each nibble into serial data. A set of multiplexers (MUXs)/DEMUXs 71 couples each P/S converter 68 to a corresponding one of the i lines 44 At node 2 52, another set of MUXs/DEMUXs 75 connects the lines 44 to a set of S/P converters 72. The S/P converters 72 convert the received serial data of each nibble into the originally transmitted nibbles. The received nibbles are reconstructed by a data block demultiplexing and reconstruction device 76 into the original data block and output as the received data block.

For blocks transferred from Node 2 52 to Node 1 50, a data block is received by the data block demultiplexing and reconstruction device 76. That block is demultiplexed into nibbles and the nibbles are sent to a set of P/S converters 74. The P/S converters 74 convert each nibble into serial format for transfer across the i lines 44. A Node 2 set of MUXs/DEMUXs 75 couples the P/S converters 74 to the i lines 44 and a Node 1 set of MUXs/DEMUXs 71 couples the lines 44 to i S/P converters 70. The S/P converters 70 convert the transmitted data into its original nibbles. The data block demultiplexing and reconstruction device 66 reconstructs the data block from the received nibbles to output the received data block. Since data is only sent in one direction at a time, this implementation operates in a half duplex mode.

FIG. 7 is a simplified diagram of one implementation of bidirectional switching circuits. The serial output from the node 1 P/S converter 68 is input into a tri-statable buffer 78. The buffer 78 has another input coupled to a voltage representing a high state. The output of the buffer 78 is the serial data which is sent via the line 85 to a Node 2 tri-statable buffer 84. A resistor 86 is coupled between the line 85 and ground. The Node 2 buffer 84 passes the serial data to a Node 2 S/P converter 72. Similarly, the serial output from the Node 2 P/S converter 74 is input into a tri-statable buffer 72. That buffer 72 also having another input coupled to a high voltage. The serial output of that buffer 82 is sent via the line 85 to a Node 1 tri-statable buffer 80. The Node 1 buffer 80 passes the serial data to a Node 1 S/P converter 70.

In another implementation, some of the i lines 44 may transfer data in one direction and the other i lines 44 transfer data in another direction. At Node 1 50, a data block is received for transmission to Node 2 52. Based on the data throughput rate required for the block and the traffic demand in the opposite direction, j, being a value from 1 to i, of the connections are used to transfer the block. The block is broken into j nibbles and converted to j sets of serial data using j of the i P/S converters 68. A corresponding number of j Node 2 S/P converters 72 and the Node 2 data block separation and reconstruction device 76 recovers the data block. In the opposite direction, up to i–j or k lines are used to transfer block data.

In a preferred implementation of the bidirectional bus for use in a gain control bus, a gain control value is sent in one direction and an acknowledgment signal is sent back. Alternately, a gain control value is sent in one direction and a status of the gain control device in the other direction.

One implementation of the hybrid parallel/serial interface is in a synchronous system and is described in conjunction with FIG. 8. A synchronous clock is used to synchronize the timing of the various components. To indicate the start of the data block transfer, a start bit is sent. As shown in FIG. 8, each line is at its normal zero level. A start bit is sent indicating the beginning of the block transfer. In this example, all the lines send a start bit, although it is only necessary to send a start bit over one line. If a start bit, such as a one value, is sent over any line, the receiving node realizes that the block data transfer has begun. Each serial nibble is sent through its corresponding line. After transfer of the nibbles, the lines return to their normal state, such as all low.

In another implementation, the start bits are also used as an indicator of functions to be performed. An illustration of such an implementation is shown in FIG. 9. As shown in FIG. 10, if any of the first bits of the connections are in a binary one state, the receiving node realizes block data is to be transferred. As shown in the table of FIG. 11 for a GC controller implementation, three combinations of start bits are used, "01," "10" and "11." "00" indicates a start bit was not sent. Each combination represents a function. In this illustration, "01" indicates that a relative decrease function should be performed, such as decreasing the data block value by 1. A "10" indicates that a relative increase function should be performed, such as increasing the data block value by 1. A "11" indicates an absolute value function, where the block maintains the same value. To increase the number of available functions, additional bits are used. For example, 2 starting bits per line are mapped to up to seven (7) functions or n starting bits for i lines are mapped up to $i^{n+1}-1$ functions. The processing device 86 performs the function on the received data block as indicated by the starting bits.

In another implementation as shown in FIG. 12, the start bits indicate a destination device. As illustrated in FIG. 13 for a two destination device/two line implementation, the combination of start bits relates to a destination device 88–92 for the transferred data block. A "01" represents device 1; a "10" represents device 2; and a "11" represents device 3. After receipt of the start bits of the data block reconstruction device 48, the reconstructed block is sent to the corresponding device 88–92. To increase the number of potential destination devices, additional start bits may be used. For n starting bits over each of i lines, up to $i^{n+1}-1$ devices are selected.

As illustrated in the table of FIG. 14, the start bits may be used to represent both function and destination device. FIG. 14 shows a three connection system having two devices, such as a RX and TX GC. Using the start bit for each line, three functions for two devices is shown. In this example, the start bit for line 3 represents the target device, a "0" for device 1 and a "1" for device 2. The bits for connections 2 and 3 represent the performed function. A "11" represents an absolute value function; a "10" represents a relative increase function; and a "01" represents a relative decrease. All three start bits as a zero, "000," is the normal non-data transfer state and "001" is not used. Additional bits may be used to add more functions or devices. For n starting bits over each of i lines, up to $i^{n+1}-1$ function/device combinations are possible.

FIG. 15 is a block diagram for a system implementing the start bits indicating both function and destination device. The recovered nibbles are received by the data block reconstruction device 48. Based on the received start bits, the processing device 86 performs the indicated function and the processed block is sent to the indicated destination device 88–92.

As shown in the flow chart of FIG. 16, the start bits indicating the function/destination are added to each nibble, (94). The nibbles are sent via the i lines, (96). Using the start bits, the proper function is performed on the data block, the data block is sent to the appropriate destination or both, (98).

Figure 17:
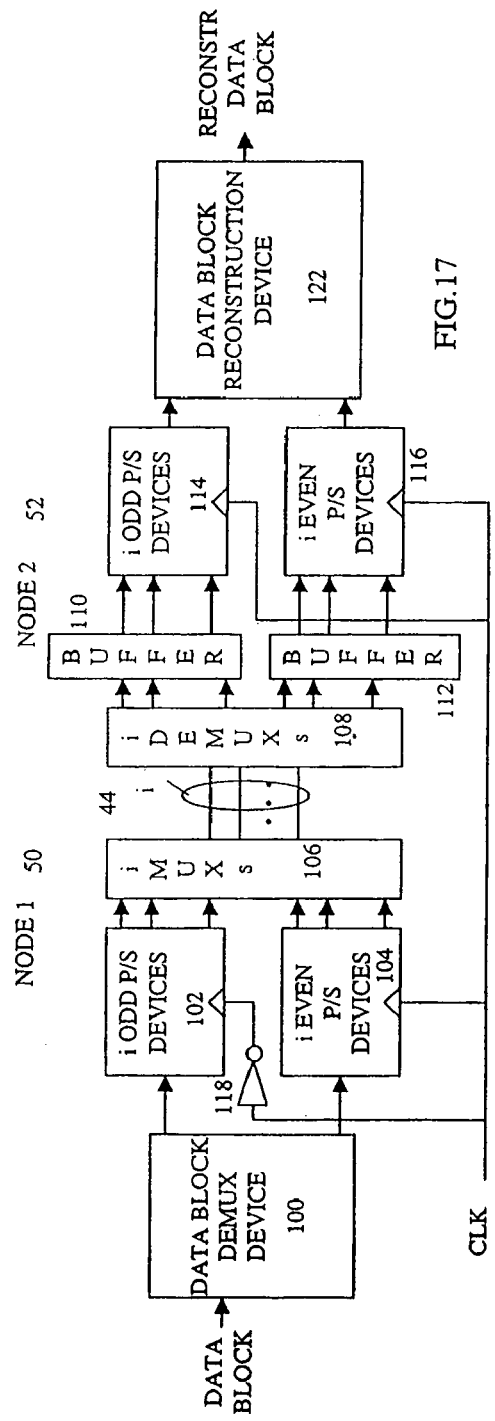
FIG. 17 is a block diagram for a positive and negative clock edge hybrid parallel/serial bus interface.

To increase the throughput in a synchronous system, both the positive (even) and negative (odd) edge of the clock are used to transfer block data. One implementation is shown in FIG. 17. The data block is received by a data block demultiplexing device 100 and demultiplexed into two (even and odd) sets of i nibbles. Each set of the i nibbles is sent to a respective set of i P/S devices 102, 104. As shown in FIG. 17, an odd P/S device set 102, having i P/S devices, has its clock signal inverted by an invertor 118. As a result, the inverted clock signal is half a clock cycle delayed with respect to the system clock. A set of i MUXs 106 select at twice the clock rate between the even P/S device set 104 and the odd P/S device set 102. The resulting data transferred over each connection is at twice the clock rate. At the other end of each connection is a corresponding DEMUX 108. The DEMUXs 108 sequentially couple each line 44 to an even 112 and odd 110 buffer, at twice the clock rate. Each buffer 112, 110 receives a corresponding even and odd bit and holds that value for a full clock cycle. An even 116 and odd 114 set of S/P devices recover the even and odd nibbles. A data block reconstruction device 122 reconstructs the data block from the transferred nibbles.

FIG. 18 illustrates the data transfer over a line of a system using the positive and negative clock edge. Even data and odd data to be transferred over line 1 is shown. The hatching indicates the negative clock edge data in the combined signal and no hatching the even. As shown, the data transfer rate is increased by two.

Figure 19:
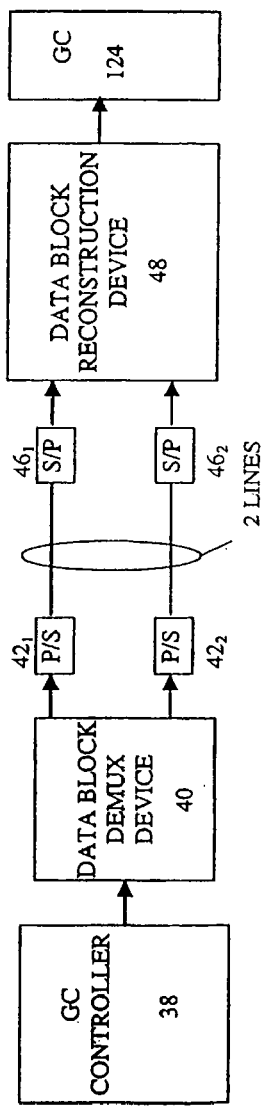
FIG. 19 is a block diagram of a 2-line GC/GC controller bus.

FIG. 19 is a preferred implementation of the hybrid parallel/serial interface used between a GC controller 38 and a GC 124. A data block, such as having 16 bits of GC control data (8 bits RX and 8 bits TX), is sent from the GC controller 38 to a data block demultiplexing device 40. The data block is demultiplexed into two nibbles, such as two eight bit nibbles. A start bit is added to each nibble, such as making 9 bits per nibble. The two nibbles are transferred over two lines using two P/S converters 42. The S/P converters 46, upon detecting the start bits, convert the received nibbles to parallel format. The data block reconstruction device reconstructs the original 16 bits to control the gain of the GC 124. If a function is indicated by the start bits, such as in FIG. 11, the AGC 124 performs that function on the received block prior to adjusting the gain.

Figure 20:
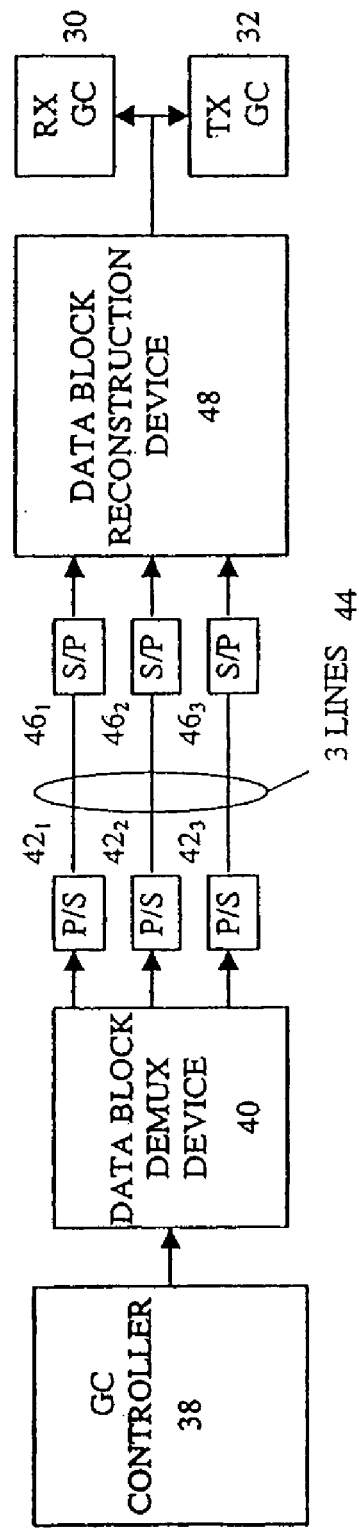
FIG. 20 is a block diagram of a 3-line GC/GC controller bus.

FIG. 20 is another preferred implementation for a hybrid parallel/serial converter, using three (3) lines, between a GC controller 38 and a RX GC 30 and TX GC 32. The GC controller 38 sends a data block to the GC 30, 32 with proper RX and TX gain values and start bits, such as per FIG. 14. If the start bits per FIG. 14 are used, Device 1 is the RX GC 30 and Device 2 is the TX GC 32. The data block demultiplexing device 40 demultiplexes the data block into three nibbles for transfer over the three lines. Using the three P/S converters 42 and three S/P converters 46, the nibbles are transferred serially over the lines and converted into the original nibbles. The data block reconstruction device 48 reconstructs the original data block and performs the function as indicated by the start bits, such as relative increase, relative decrease and absolute value. The resulting data is sent to either the RX or TX GC 30, 32 as indicated by the start bits.

What is claimed is:

1. A method employed by a base station for bidirectional transfer of data, comprising:
   providing a data block for transfer to a remote location;
   demultiplexing the data block into a plurality of sent nibbles, each sent nibble having a plurality of bits;
   for each sent nibble:
   converting that sent nibble into serial data;
   providing an outgoing line and transferring the nibble serial data over the line to said remote location;
   receiving data from a remote location which data has been demultiplexed into a plurality of received nibbles, each received nibble having a plurality of bits;
   for each received nibble:
   providing a line for transferring the received nibble of serial data to an output;
   converting that received nibble serial data into parallel data to recover that received nibble; and
   combining the recovered nibbles into the data block.

2. The method of claim 1 wherein a number of bits in a data block to be transferred to a remote location is N and a number of outgoing lines is i and 1<i<N.

3. The method of claim 1 wherein a number of bits in a data block to be received from a remote location is N and a number of outgoing lines is i and 1<i<N.

4. The method of claim 1 wherein a number of bits in a sent nibble is four and a number of outgoing lines is two.

5. The method of claim 1 wherein a number of bits in a received nibble is four and a number of incoming lines is two.

6. A method employed by a base station for receipt of a data block at a receiving node connected to a send node by an interface, the method comprising:
   providing m lines each for receiving from said send node n bits of serial data which have been demultiplexed from said data block into m sets of n bits of serial data, each of said m sets having a start bit, said m start bits collectively representing one of a particular mathematical function or destination;
   transferring over said m lines an associated one of the m sets to the receiving node;
   receiving at the receiving node each of the transferred m sets; and
   utilizing the received m sets in accordance with the m start bits.

7. The method of claim 6 wherein at least one of the m start bits being in a one state and when the interface is not transmitting data, all the separate lines being in a zero state.

8. The method of claim 6 wherein the m start bits represent a start of data transfer.

9. The method of claim 6 wherein the m start bits collectively represent a particular mathematical function and not a destination.

10. The method of claim 6 wherein functions that the m start bits collectively represent one of a relative increase, a relative decrease and an absolute value functions.

11. The method of claim 6 wherein the m start bits collectively represent a particular destination and not a mathematical function.

12. The method of claim 11 wherein the m start bits collectively indicate a receive and transmit gain controller.

13. The method of claim 6 wherein the m start bits collectively represent both a particular mathematical function and a particular destination.

14. A method employed by a base station for determining a number of i bus connections required to receive block data over an incoming bus, each block of the block data having N number of bits, the method comprising:
   determining a maximum latency allowed for transfer of the block data;
   determining a minimum number of connections required to transfer the data block with the maximum latency; and
   determining i with i being a value at least the minimum number of required connections.

15. The method of claim 14 wherein the i bus connections correspond to i pins on a chip.

16. The method of claim 14 wherein $1<i<N$.

17. A hybrid, bidirectional, serial to parallel bus interface for a base station comprising:
   a data block demultiplexing device having an input configured to receive a first data block to be sent to a remote location and demultiplexing the first type of nibbles data block into a plurality of first type of nibbles, each first type of nibble having a plurality of bits;
   for each first type of nibble:
      a parallel to serial converter for converting that nibble into serial data;
      a transfer line for transferring that nibble serial data to a remote location;
      a plurality of receiving lines each receiving from a remote location one of a second type of nibbles, said second type of nibbles being divided from a second data block being sent in serial fashion from said remote location, each second type of nibbles having a given number of bits;
      a serial to parallel converter for each receiving line for converting each second type of nibble serial data to recover its associated second type of nibble; and
      a data block reconstruction device for combining the recovered second type of nibbles into said second data block.

18. The base station interface of claim 17 wherein a number of bits in said second data blocks is N and a number of the receiving lines is i and $1<i<N$.

19. The base station interface of claim 17 wherein a number of bits in a nibble of the first type is four and a number of receiving lines is two.

20. A hybrid serial to parallel bus interface for a base station comprising:
   means having an input configured to receive a first data block for demultiplexing the first data block into a plurality of nibbles of a first type, each nibble of a first type having a plurality of bits;
   for each nibble of the first type:
      means for converting that nibble into serial data;
      an output line for each nibble of the first type for transferring the nibbles of said first type serial data to a remote location;
      a plurality of receiving lines each receiving in serial fashion one of a plurality of nibbles of a second type each comprised of a plurality of bits, said nibbles of a second type being divided out of a second data block being sent to said base station;
      means coupled to each receiving line for converting the nibble of the second type on the associated receiving line to recover that nibble; and
      means for combining the recovered nibbles of the second type into the second data block.

21. The interface of claim 20 wherein a number of bits in said data block is N and a number of the receiving lines is i and $1<i<N$.

22. The interface of claim 20 wherein a number of bits in a nibble of the first type is four and a number of lines is two.

23. A hybrid serial to parallel bus interface employed by a base station for receiving a data block at a first node transferred from a second node, said data block having been demultiplexing into m sets of n data bits and a start bit, the m start bits collectively representing one of a particular function to be performed or a destination, the interface comprising:
   for each of the m sets, a separate line for coupling that set of the m sets from the second node to the first node; and
   a data block reconstruction device for receiving the m sets, for combining the m sets into said data block and for utilizing the m sets in accordance with the m start bits.

24. The interface of claim 23 wherein at least one of the m start bits is in a binary one state to represent data being transmitted and all of the separate lines are maintained in a binary zero state when no data is being transmitted and said interface having means to recognize the aforesaid data/no data conditions.

25. The interface of claim 23 wherein the m start bits represent a start of data transfer.

26. The interface of claim 23 wherein the m start bits collectively represent a particular function to be performed and not a destination.

27. The interface of claim 23 wherein functions that the m start bits collectively represent include a relative increase, a relative decrease and an absolute value function.

28. The interface of claim 23 wherein the m start bits collectively represent a particular destination and not a function to be performed.

29. The interface of claim 28 wherein the m start bits collectively indicate a receive and transmit gain controller.

30. The interface of claim 23 wherein the m start bits collectively represent both a particular function to be performed and a particular destination.

31. A base station having a hybrid serial to parallel bus interface for bidirectional transfer of data between a first node and a second node, the interface comprising:
   means for demultiplexing a first data block to be sent into m sets of n bits;
   means for adding a start bit to each of the m sets, the m start bits collectively representing one of a particular function to be performed or destination;
   means for transferring from the first node each of the m sets over a separate line to the second node;
   means for receiving from the second node at receiving lines one of m sets of n bits each demultiplexed from a second data block and having a start bit added thereto; and
   means for utilizing the received m sets in accordance with the m start bits.

32. The base station interface of claim 31 wherein the adding means sets at least one of the m start bits to a one state and when the interface is not transmitting data, all the separate lines to a zero state.

33. The base station interface of claim 31 wherein at least one of the m start bits represents a start of data transfer.

34. The base station interface of claim 31 wherein the m start bits collectively represent a particular function to be performed and not a destination.

35. The base station interface of claim 31 wherein functions that the m start bits collectively represent include a relative increase, a relative decrease and an absolute value function.

36. The base station interface of claim 31 wherein the m start bits collectively represent a particular destination and not a function to be performed.

37. The base station interface of claim 36 wherein the m start bits collectively identify a receive and transmit gain controller.

38. The base station interface of claim 31 wherein the m start bits collectively represent both a particular function to be performed and a particular destination.

39. A bi-directional serial to parallel bus interface employed by a base station comprising:
   a first plurality of lines for transferring data blocks, the plurality of lines being less than a number of bits in each data block;
   said interface sending first data blocks to a remote location over the first plurality of lines, said interface demultiplexing the data block into a plurality of first nibbles, the plurality of first nibbles being equal in number to the first plurality of lines, each first nibble having a plurality of bits; and
   said interface receiving a second data block over a second plurality of lines, said second data block being separated into a plurality of second nibbles, the plurality of second nibbles being equal in number to the plurality of lines, each second nibble having a plurality of bits; and
   means for constructing said second nibbles into said second data block.

40. The interface of claim 39 wherein the interface demultiplexes the data block into a plurality of third nibbles, a number j of the third nibbles being less than the number N of lines and transferring the third nibbles over j lines.

41. The interface of claim 40 wherein fourth data blocks demultiplexed into K bits, where K is less than or equal to N−j lines, are received over K lines provided in said interface.

42. The interface of claim 39 wherein the first data blocks include gain control information.

43. The interface of claim 42 wherein the second data blocks include an acknowledgment of receipt of the gain control information.

44. The interface of claim 42 wherein the second data blocks include information representing a status.

* * * * *

UNITED STATES PATENT AND TRADEMARK OFFICE
CERTIFICATE OF CORRECTION

| | | |
|---|---|---|
| PATENT NO. | : 7,107,479 B2 | Page 1 of 2 |
| APPLICATION NO. | : 11/001958 | |
| DATED | : September 12, 2006 | |
| INVENTOR(S) | : Gredone et al. | |

It is certified that error appears in the above-identified patent and that said Letters Patent is hereby corrected as shown below:

ON THE TITLE PAGE

Item (56), line 9, U. S. PATENT DOCUMENTS, page 2, left column, insert the following U. S. PATENTS , -- 5,784,003  7/1998   Dahlgren
   6,058,427  5/2000   Viswanath et al.
   6,611,217  8/2003   Buchanan et al.
   6,792,003  9/2004   Potluri et al.
   6,961,347  11/2005  Bunton et al.--.

Item (56), OTHER PUBLICATIONS, page 1, right column, line 1, after "Herzen et al.,", delete "Multi-Chanel" and insert therefor --"Multi-Channel--.

Item (56), OTHER PUBLICATIONS, page 2, right column, line 16, after the words "Point-To-Point", delete "Application" and insert therefor --Applications--.

At column 1, line 17, before the word "receive", delete "a".

At column 1, line 60, before "RX", delete "a" and insert therefor --an--.

At column 3, line 7, before the word "approach", delete ",bidirectional," and insert therefor --bidirectional--.

At column 3, line 18, after "44", insert --.--.

At column 4, line 56, before "RX", delete "a" and insert therefor --an--.

At column 5, line 58, before "RX", delete "a" and insert therefor --an--.

UNITED STATES PATENT AND TRADEMARK OFFICE
CERTIFICATE OF CORRECTION

PATENT NO. : 7,107,479 B2
APPLICATION NO. : 11/001958
DATED : September 12, 2006
INVENTOR(S) : Gredone et al.

It is certified that error appears in the above-identified patent and that said Letters Patent is hereby corrected as shown below:

At claim 23, column 8, line 11, before the words "into m sets", delete "demultiplexing" and insert therefor --demultiplexed--.

Signed and Sealed this

Tenth Day of April, 2007

JON W. DUDAS
*Director of the United States Patent and Trademark Office*